US012610761B2

(12) United States Patent
Chen et al.

(10) Patent No.: US 12,610,761 B2
(45) Date of Patent: Apr. 21, 2026

(54) METAL ETCHING WITH REDUCED TILT ANGLE

(71) Applicant: Taiwan Semiconductor Manufacturing Company, Ltd., Hsinchu (TW)

(72) Inventors: Chao-Hsuan Chen, Hsinchu (TW); I-Wei Yang, Yilan (TW); Chang-Han Tsai, Hsinchu (TW); Shu-Uei Jang, Hsinchu (TW); Shu-Yuan Ku, Hsinchu (TW); Yih-Ann Lin, Hsinchu (TW); Ryan Chia-Jen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 282 days.

(21) Appl. No.: 18/341,448

(22) Filed: Jun. 26, 2023

(65) Prior Publication Data

US 2024/0429064 A1    Dec. 26, 2024

(51) Int. Cl.
| | |
|---|---|
| *H01L 21/3213* | (2006.01) |
| *H01L 21/02* | (2006.01) |
| *H01L 21/033* | (2006.01) |
| *H01L 21/28* | (2025.01) |
| *H10D 30/01* | (2025.01) |
| *H10D 64/01* | (2025.01) |
| *H10D 84/01* | (2025.01) |
| *H10D 84/03* | (2025.01) |

(52) U.S. Cl.
CPC .. *H01L 21/32136* (2013.01); *H01L 21/02118* (2013.01); *H01L 21/0337* (2013.01); *H01L 21/28114* (2013.01); *H01L 21/32139* (2013.01); *H10D 30/024* (2025.01); *H10D 64/017* (2025.01); *H10D 84/0135* (2025.01); *H10D 84/0158* (2025.01); *H10D 84/038* (2025.01)

(58) Field of Classification Search
None
See application file for complete search history.

(56) References Cited

U.S. PATENT DOCUMENTS

| | | | | |
|---|---|---|---|---|
| 4,855,017 A * | 8/1989 | Douglas | .............. | H01L 21/3085 |
| | | | | 438/700 |
| 6,177,353 B1 * | 1/2001 | Gutsche | ............ | H01L 21/32136 |
| | | | | 257/E21.314 |
| 9,831,346 B1 * | 11/2017 | Zang | .................. | H01L 21/28518 |
| 2002/0027286 A1 * | 3/2002 | Sundararajan | .... | H01L 21/02211 |
| | | | | 257/E21.27 |
| 2004/0247949 A1 * | 12/2004 | Akedo | ............... | H10K 59/8731 |
| | | | | 428/917 |
| 2005/0181604 A1 * | 8/2005 | Sperlich | ............ | H01L 21/32139 |
| | | | | 257/E21.27 |
| 2006/0137710 A1 * | 6/2006 | Lim | .......................... | B08B 3/08 |
| | | | | 134/1.1 |
| 2006/0211265 A1 * | 9/2006 | Trott | ................... | H01L 21/3185 |
| | | | | 257/E21.292 |

(Continued)

*Primary Examiner* — Allan W. Olsen
(74) *Attorney, Agent, or Firm* — Ingrassia Fisher & Lorenz, LLP

(57) ABSTRACT

Methods for etching metal, such as for processing a metal gate, are provided. A method includes forming a hard mask over the metal, wherein the hard mask includes a sidewall defining an opening; and performing a plasma etching process including cycles of depositing a carbon nitride film on the sidewall and etching the metal.

20 Claims, 9 Drawing Sheets

(56)         References Cited

U.S. PATENT DOCUMENTS

| | | | | |
|---|---|---|---|---|
| 2012/0214310 A1* | 8/2012 | Sheu | ................. | H01L 21/31144 |
| | | | | 156/345.28 |
| 2013/0323920 A1* | 12/2013 | Chang | .................... | H10B 12/01 |
| | | | | 438/586 |
| 2014/0134842 A1* | 5/2014 | Zhang | .............. | H01L 21/31116 |
| | | | | 438/694 |
| 2015/0162416 A1* | 6/2015 | Chang | ................. | H10D 64/671 |
| | | | | 257/288 |
| 2021/0035796 A1* | 2/2021 | Qin | ................... | H01L 21/31138 |
| 2021/0333457 A1* | 10/2021 | Dong | ................... | G02B 5/3058 |
| 2022/0293520 A1* | 9/2022 | Huang | ............. | H01L 21/76834 |
| 2023/0060825 A1* | 3/2023 | Kao | .................. | H10D 30/6735 |
| 2024/0321581 A1* | 9/2024 | Lin | ................... | H01L 21/28123 |

\* cited by examiner

10

107          Y          111          109

103

105

X ←----          ----→ X

Y

METAL ETCHING WITH REDUCED TILT ANGLE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
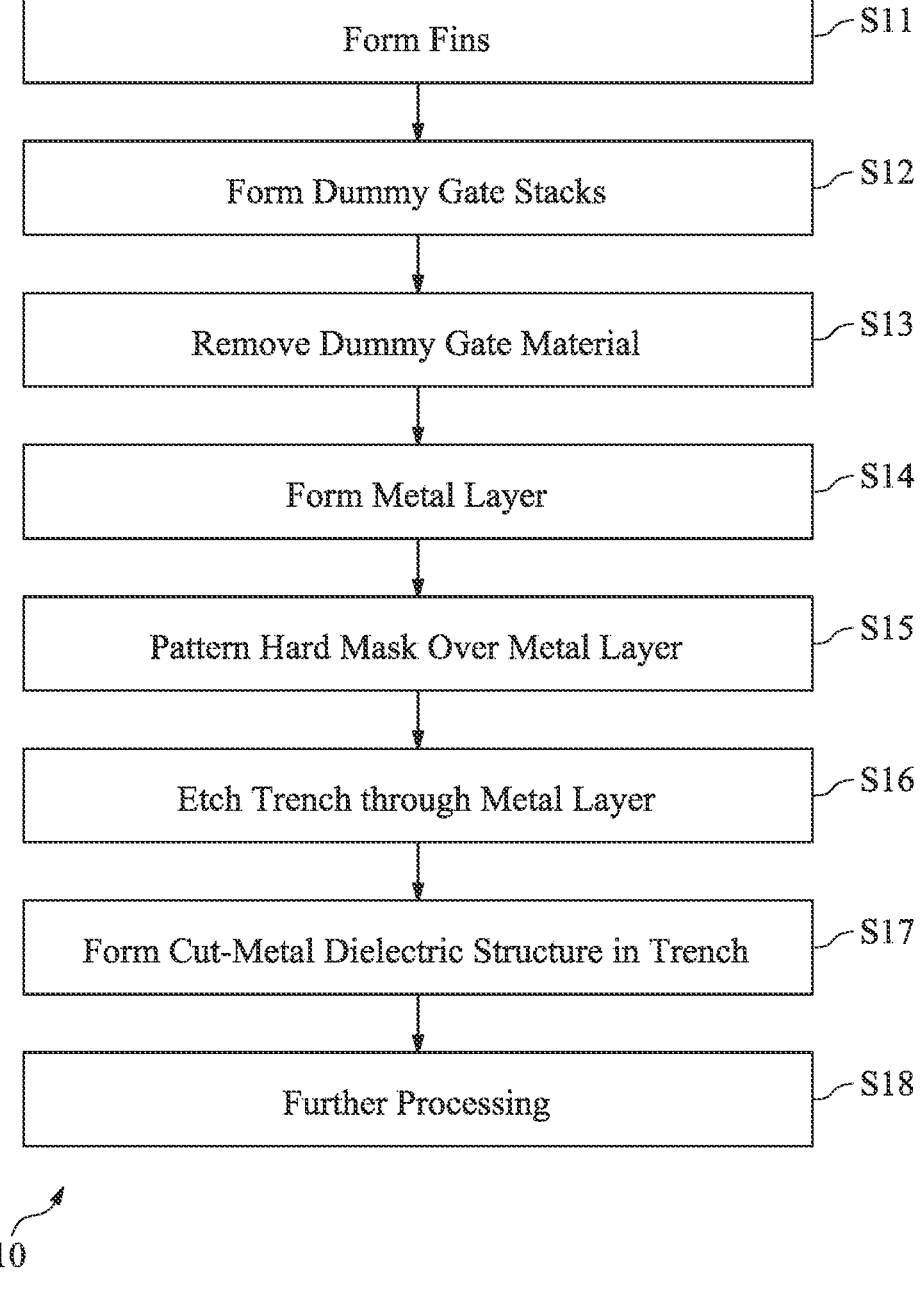
FIG. 1 is a flow chart illustrating a method, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over", "overlying", "above", "upper", "top", "under", "underlying", "beneath", "below", "lower", "bottom", "side", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In certain embodiments herein, a "material structure" is a structure that includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material; and a structure that is formed of a "material" includes at least 50 wt. % of the identified material, for example at least 60 wt. % of the identified material, at least 75 wt. % of the identified material, at least 90 wt. % of the identified material, at least 95 wt. % of the identified material, or at least 99 wt. % of the identified material. For example, certain embodiments, each of a tungsten structure and a structure formed of tungsten is a structure that is at least 50 wt. %, at least 60 wt. %, at least 75 wt. %, at least 90 wt. %, at least 95 wt. %, or at least 99 wt. % of tungsten.

For the sake of brevity, typical techniques related to semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many typical processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Presented herein are embodiments of semiconductor devices and of methods for fabricating such devices. Methods described herein may be easily integrated into the current process flow. Further, methods described herein relate to the formation of an insulation structure, such as a cut-metal dielectric structure, used to cut metal gate lines into separate metal gates and separate functional devices.

Embodiments herein describe methods for etching a trench through a metal gate lines and into the dielectric material lying beneath the metal gate line. Further, the methods avoid issues related to an excessive tilt angle of the trench. Specifically, the trench formed by cutting the metal gate line is a high aspect ratio trench. It has been found that when etching such high aspect ratio trenches at wafer edges, the resulting trenches suffer from excessive tilt angles due to by-product accumulation such as on trench sidewalls. Tilted trenches may be reduced vertical depth and fail to completely pass through the metal gate line. As a result, device shorts are increased at wafer edges.

Embodiments of the present disclosure offer advantages over the existing art, though it is understood that other embodiments may offer different advantages, not all advantages are necessarily discussed herein, and no particular advantage is required for all embodiments.

Figure 2:
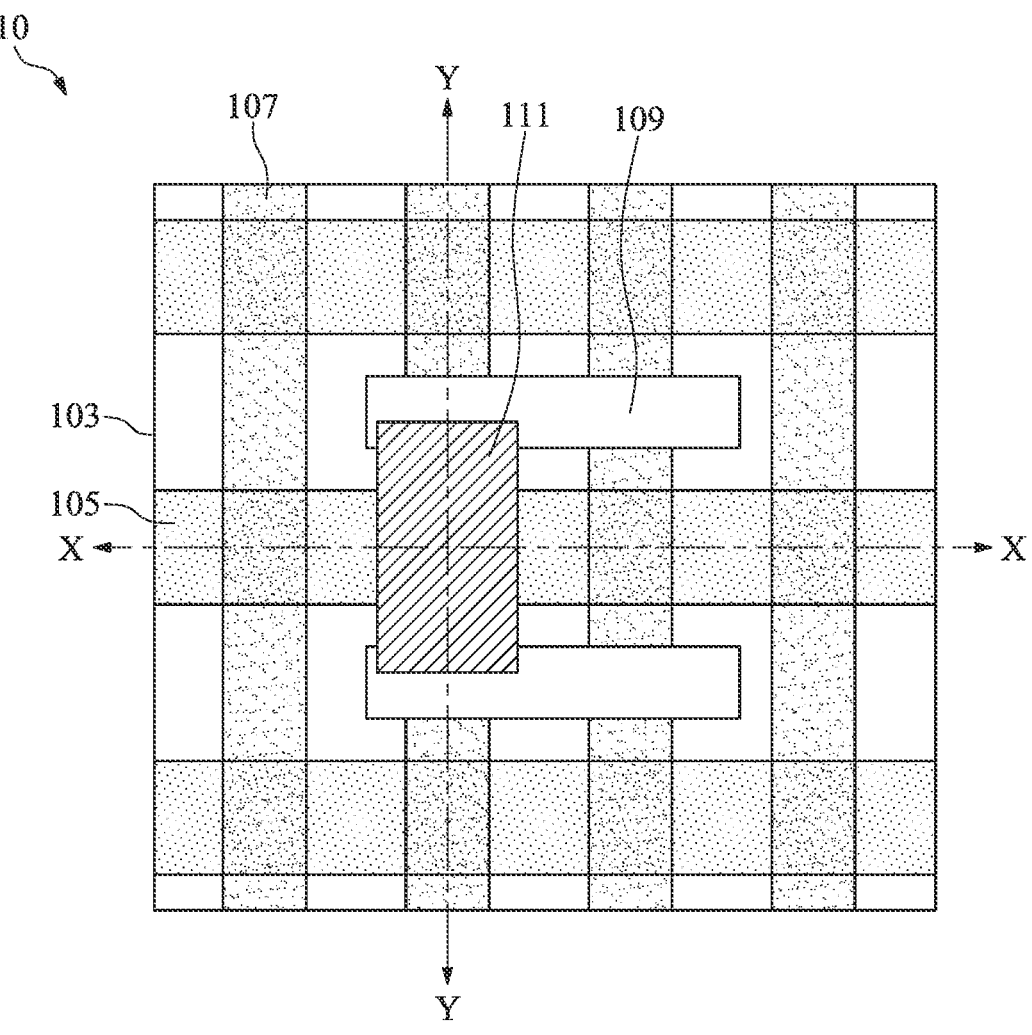
FIG. 2 illustrates a top-down view of a semiconductor device, according to some embodiments.

For purposes of the discussion that follows, FIG. 1 provides a flow chart for a method 10 for fabricating a semiconductor device 100 during a semiconductor fabrication process. Method 10 is described below with reference to FIGS. 2-8 which illustrate the semiconductor device 100 at various stages of fabrication according to method 10. FIG. 2 illustrates a top-down view of an intermediate structure in forming a device 100, such as a FinFET semiconductor device, according to some embodiments. FIGS. 3-8 are cross-sectional views in which the vertical direction is defined by the Z-axis and the lateral direction is defined by the Y-axis, i.e., are Y-cuts. It is understood that method 10 includes steps having features of a complementary metal-oxide-semiconductor (CMOS) technology process flow and thus, are only described briefly herein. Also, additional steps may be performed before, after, and/or during method 10.

In FIG. 2, the device 100 includes a substrate 103, fins 105, and a plurality of gate electrodes 107 over the fins 105. Fins 105 may include a multi-layer structure comprising a plurality of nanosheets such as in a Gate-All-Around (GAA) device.

FIG. 2 further illustrates a plurality of cut-metal dielectric structures 109 separating two of the gate electrodes 107 and a Continuous Poly On Diffusion Edge (CPODE) structure 111 dividing one of the fins 105 in two and intersecting the cut-metal gate structures 109.

Although three fins 105 are illustrated in FIG. 2 and four fins 105 are illustrated in the following figures, it is understood that depending on the desired design and number of the semiconductor devices 100, any suitable number of fins 105 may be formed in the multi-layer structure 103 to form the desired semiconductor devices 100. Furthermore, any suitable number of gate electrodes 107, CPODE structures 111, and cut-metal gate structures 109 may be formed to form the desired semiconductor devices 100.

In FIG. 2, the X-axis extends through the length of the fin 105 and passes through the CPODE structure 111. Further, the Y-axis extends through the length of a gate electrode 107 that has been separated by the two cut-metal dielectric structures 109, through the two cut-metal dielectric structures 109, and through the CPODE structure 111 intersecting the two cut-metal dielectric structures 109. The following cross-sectional views are taken along the Y-axis.

Figure 3:
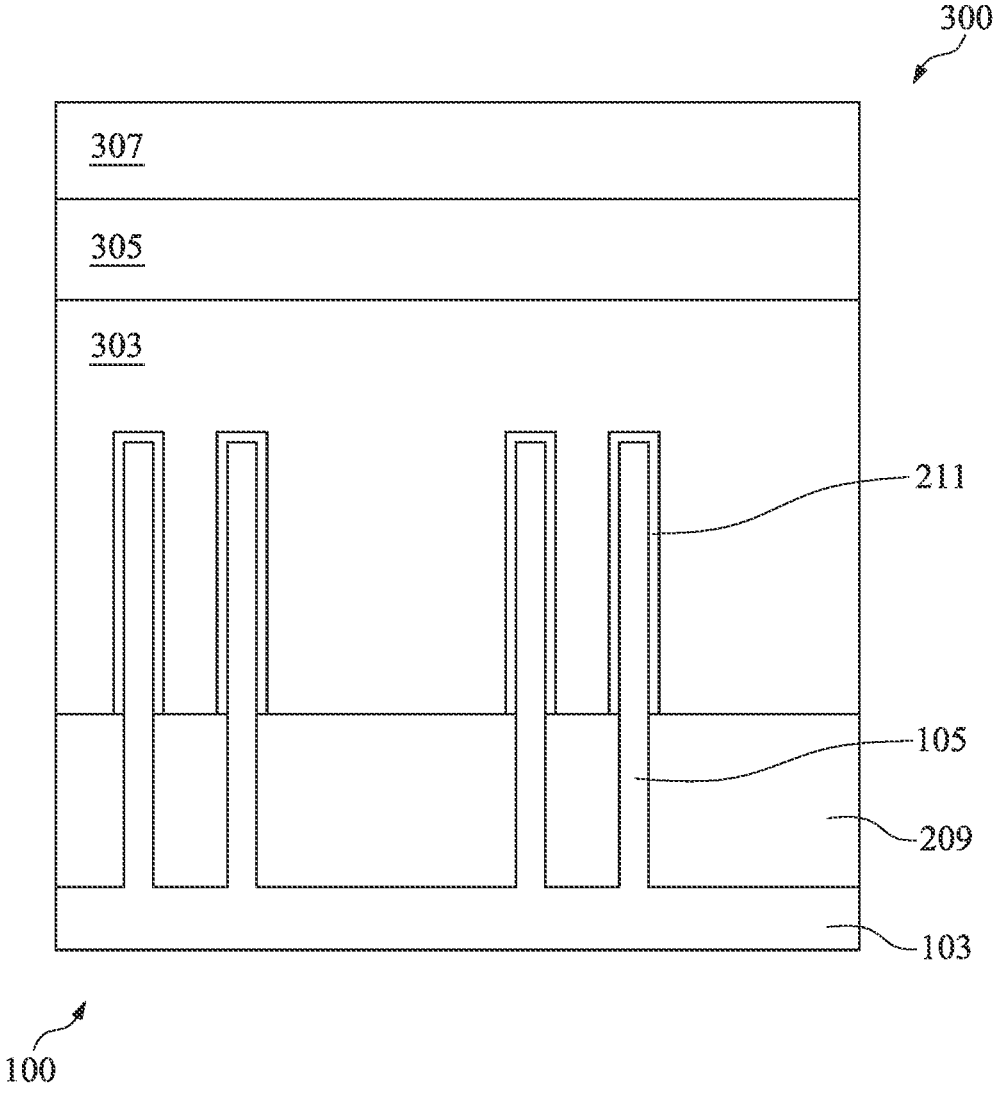
FIGS. 3-8 are cross-sectional views of a device during successive stages of fabrication of the method of FIG. 1, in accordance with some embodiments.

Referring now to FIGS. 1 and 3, a method 10 for fabricating a semiconductor device 100 includes, at S11, forming fin structures 105 over a semiconductor substrate 103, in accordance with some embodiments.

In an embodiment the substrate 103 is a semiconductor substrate, which may be, for example, a silicon substrate, a silicon germanium substrate, a germanium substrate, a III-V material substrate (e.g., GaAs, GaP, GaAsP, AlInAs, AlGaAs, GaInAs, InAs, GaInP, InP, InSb, and/or GaInAsP; or a combination thereof), or a substrate formed of other semiconductor materials with, for example, high band-to-band tunneling (BTBT). The substrate 103 may be doped or un-doped. In some embodiments, the substrate 103 may be a bulk semiconductor substrate, such as a bulk silicon substrate that is a wafer, a semiconductor-on-insulator (SOI) substrate, a multi-layered or gradient substrate, or the like. A multi-layer structure may be formed over the substrate 103. For example, the multi-layer structure may include alternating layers of first semiconductor material and second semiconductor material. According to some embodiments, the first layers may be formed using a first semiconductor material with a first lattice constant, such as SiGe, Ge, Si, GaAs, InSb, GaSb, InAlAs, InGaAs, GaSbP, GaAsSb, combinations of these, or the like. In some embodiments, a first layer of the first semiconductor material (e.g., SiGe) is epitaxially grown on the substrate 103 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized. In some embodiments, the first layer is formed to thicknesses of from about 3 nm and about 10 nm. However, any suitable thickness may be utilized while remaining within the scope of the embodiments.

After the first layer has been formed over the substrate 103, a second layer may be formed over the first layer. According to some embodiments, the second layers may be formed using a second semiconductor material such as Si, SiGe, Ge, GaAs, InSb, GaSb, InAlAs, InGaAs, GaSbP, GaAsSb, combinations of these, or the like with a second lattice constant that is different from the first lattice constant of the first layer. In a particular embodiment in which the first layer is silicon germanium, the second layer is a material such as silicon. However, any suitable combination of materials may be utilized for the first layers and the second layers.

In some embodiments, the second layer is epitaxially grown on the first layer using a deposition technique similar to that used to form the first layer. However, the second layer may use any of the deposition techniques suitable for forming the first layer, as set forth above or any other suitable technique. According to some embodiments, the second layer is formed to a similar thickness to that of the first layer. However, the second layer may also be formed to a thickness that is different from the first layer. According to some embodiments, the second layer may be formed to a thickness of from about 5 nm and about 15 nm. However, any suitable thickness may be used.

After forming the second layer over the first layer, the deposition process is repeated to form the remaining material layers in the series of alternating materials of the first layers and the second layers until a desired topmost layer of the multi-layer stack has been formed. According to the present embodiment, the first layers may be formed to a same or similar first thickness and the second layers may be formed to the same or similar second thickness. However, the first layers may have different thicknesses from one another and/or the second layers may have different thicknesses from one another and any combination of thicknesses may be used for the first layers and the second layers. According to the present embodiment, the topmost layer of the multi-layer stack is formed as a second layer; however, in other embodiments, the topmost layer of the multi-layer stack may be formed as a first layer. Additionally, although embodiments are disclosed herein comprising three of the first layers and three of the second layers, the multi-layer stack may have any suitable number of layers (e.g., nanosheets). For example, the multi-layer stack may comprise from two to tene nanosheets. In some embodiments, the multi-layer stack may comprise equal numbers of the first layers to the second layers; however, in other embodiments, the number of the first layers may be different from the number of the second layers. According to some embodiments, the multi-layer stack may be formed to a height of from about 12 nm to about 100 nm. However, any suitable height may be used.

FIG. 3 further illustrates, a patterning process to form fin structure 105 and a formation of isolation regions 209 in an intermediate stage of manufacturing the Semiconductor device 100, in accordance with some embodiments. The patterning process is used to form fins 105 and to form trenches between the fins 105 in preparation for forming the isolation regions 209. The patterning process for forming the fins 105, according to some embodiments, comprises applying a photoresist over the substrate and then patterning and developing the photoresist to form a mask over the substrate. After being formed, the mask is then used during an etching process, such as an anisotropic etching process to transfer the pattern of the mask into the underlying layers to form the trenches into the substrate 103 to define the fins 105, wherein the fins 105 are separated by the trenches.

Additionally, while a single mask process has been described, this is intended to be illustrative and is not intended to be limiting, as the device structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used in further patterning.

In an exemplary embodiment, the isolation regions 209 are formed as shallow trench isolation regions by depositing a dielectric material in the trenches. According to some embodiments, the dielectric material used to form the isolation regions 209 may be a material such as an oxide material (e.g., a flowable oxide), high-density plasma (HDP) oxide, or the like. The dielectric material may be formed, after an optional cleaning and lining of the trenches, using either a chemical vapor deposition (CVD) method (e.g., the HARP process), a high density plasma CVD method, or other suitable method of formation to fill or overfill the regions around the fins 105. In some embodiments, a post placement anneal process (e.g., oxide densification) is performed to densify the material of the isolation regions 209 and to reduce its wet etch rate. A chemical mechanical polishing (CMP), an etch, a combination of these, or the like may be performed to remove any excess material of the isolation regions 209.

After the dielectric material has been deposited to fill or overfill the regions around the fins 105, the dielectric material may then be recessed away from the surface of the fins 105 to form the isolation regions 209. The recessing may be performed to expose at least a portion of the sidewalls of the fins 105 adjacent to the top surface of the fins 105. The dielectric material may be recessed using a wet etch by dipping the top surface of the fins 105 into an etchant selective to the material of the dielectric material, although other methods, such as a reactive ion etch, a dry etch, chemical oxide removal, or dry chemical clean may be used.

Still cross-referencing FIGS. 1 and 3, method 10 may continue, at S12, with forming sacrificial or dummy gate stacks 301 over the fins 105, in accordance with some embodiments. According to some embodiments, the dummy gate stacks 301 comprise a dummy gate dielectric 211, a dummy gate electrode 303 over the dummy gate dielectric 211, a first hard mask 305 over the dummy gate electrode 303, and a second hard mask 307 over the first hard mask 305.

As shown in FIG. 3, a dummy gate dielectric 211 is formed over the exposed portions of the fins 105. After the isolation regions 209 have been formed, the dummy gate dielectric 211 may be formed by thermal oxidation, chemical vapor deposition, sputtering, or any other methods known and used in the art for forming a gate dielectric. Depending on the technique of gate dielectric formation, the dummy gate dielectric 211 thickness on the top may be different from the dummy dielectric thickness on the sidewall. In some embodiments, the dummy gate dielectric 211 may be formed by depositing a material such as silicon and then oxidizing or nitridizing the silicon layer in order to form a dielectric such as the silicon dioxide or silicon oxynitride. In such embodiments, the dummy gate dielectric 211 may be formed to a thickness of from about 3 Å to about 100 Å, such as about 10 Å. In other embodiments, the dummy gate dielectric 211 may also be formed from a high permittivity (high-k) material such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of from about 0.5 Å to about 100 Å, such as about 10 Å or less. Additionally, any combination of silicon dioxide, silicon oxynitride, and/or high-k materials may also be used for the dummy gate dielectric 211.

As shown in FIG. 3, the dummy gate electrode 303 is formed over the dummy gate dielectric 211. In some embodiments, the dummy gate electrode 303 comprises a conductive material and may be selected from a group comprising of polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode 303 may be deposited by chemical vapor deposition (CVD), sputter deposition, or other techniques known and used in the art for depositing conductive materials. The thickness of the dummy gate electrode 303 may be from about 5 Å to about 500 Å. The top surface of the dummy gate electrode 303 may have a non-planar top surface, and may be planarized prior to patterning of the dummy gate electrode 303 or gate etch. Ions may or may not be introduced into the dummy gate electrode 303 at this point. Ions may be introduced, for example, by ion implantation techniques.

After the dummy gate electrode 303 has been formed, the dummy gate dielectric 211 and the dummy gate electrode 303 may be patterned. In an embodiment the patterning may be performed by initially forming a first hard mask 305 over the dummy gate electrode 303 and forming the second hard mask 307 over the first hard mask 305.

According to some embodiments, the first hard mask 305 comprises a dielectric material such as silicon nitride (SiN), oxide (OX), silicon oxide (SiO), titanium nitride (TiN), silicon oxynitride (SiON), combinations of these, or the like. The first hard mask 305 may be formed using a process such as chemical vapor deposition, plasma enhanced chemical vapor deposition, atomic layer deposition, or the like. However, any other suitable material and method of formation may be utilized. The first hard mask 305 may be formed to a thickness of from about 20 Å to about 3000 Å, such as about 20 Å.

The second hard mask 307 comprises a separate dielectric material from the material of the first hard mask 305. The second hard mask 307 may comprise any of the materials and use any of the processes suitable for forming the first hard mask 305 and may be formed to a same or similar thickness as the first hard mask 305. In embodiments where the first hard mask 305 comprises silicon nitride (SiN), the second hard mask 307 may be e.g., an oxide (OX). However, any suitable dielectric materials, processes and thicknesses may be used to form the second hard mask.

After the first hard mask 305 and the second hard mask 307 have been formed, the first hard mask 305 and the second hard mask 307 may be patterned. Patterning of the first hard mask 305 and second hard mask 307 occurs in the X-dimension, i.e., distanced into or out of the drawing sheet for the cross-sectional views of FIGS. 3-8. Thereafter, various processes may be performed to form desired structures, etching of the dummy gate material to form distinct dummy gate stacks, formation of spacers, etching of openings for source/drain regions, epitaxial growth of source/drain regions, implant processes, and other typical gate processing. Further, such processing includes removal of the first hard mask 305 and the second hard mask 307. According to some embodiments, one or more etching processes and/or the chemical mechanical planarization (CMP) may be utilized to remove the first hard mask 305 and the second hard mask 307. As such, the dummy gate electrode 303 is exposed after the removal of the first hard mask 305.

Figure 4:
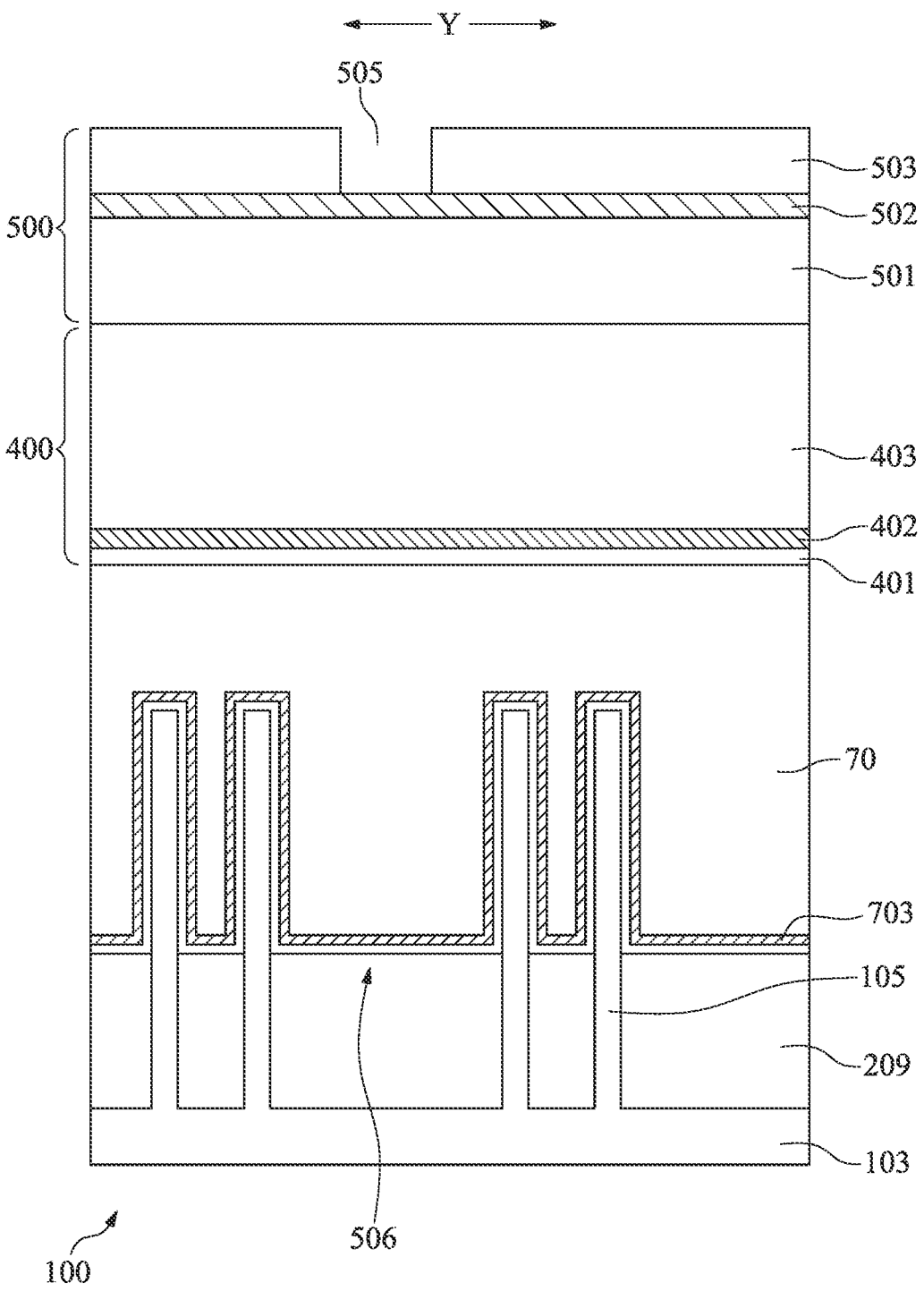

Cross-referencing FIGS. 1 and 4, method 10 may continue, at S13, with removing the dummy gate electrode 303 and the dummy gate dielectric 211.

After being exposed by removal of the first hard mask 305, the dummy gate electrode 303 may be removed in order to expose the underlying dummy gate dielectric 211. In an embodiment the dummy gate electrode 303 is removed using, e.g., one or more wet or dry etching process that utilizes etchants that are selective to the material of the dummy gate electrode 303. However, any suitable removal process may be utilized.

After the dummy gate dielectric 211 has been exposed by removal of the dummy gate electrode 303, the dummy gate dielectric 211 may be removed. In an embodiment the dummy gate dielectric 211 may be removed using, e.g., a wet etching process, although any suitable etching process may be utilized.

When forming a GAA device 100, the method 10 may include a wire-release process to form nanostructures, i.e., vertically-spaced nanosheets, in accordance with some embodiments. The wire release process step may also be referred to as a sheet release process step, a sheet formation process step, a nanosheet formation process step or a wire formation process step. In an embodiment the first layers may be removed using a wet etching process that selectively removes the material of the first layers (e.g., silicon germanium (SiGe)) without significantly removing the material of the substrate 103 and the material of the second layers (e.g., silicon (Si)). However, any suitable removal process may be utilized.

For example, in an embodiment, an etchant such as a high temperature HCl may be used to selectively remove the material of the first layers (e.g., SiGe) without substantively removing the material of the substrate 103 and/or the material of the second layers (e.g., Si). Additionally, the wet etching process may be performed at a temperature of from 400° C. to about 600° C., such as about 560° C., and for a time of from about 100 seconds to about 600 seconds, such as about 300 seconds. However, any suitable etchant, process parameters, and time can be utilized.

In FIGS. 1 and 4, method 10 may continue, at S14, with forming a gate layer, including a gate dielectric and gate metal. FIG. 4 illustrates the formation of a gate dielectric 703 over the nanostructures 701, according to some embodiments.

Figure 6:
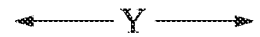

FIG. 6 further illustrates the formation of the gate dielectric 703, according to some embodiments. In an embodiment the gate dielectric 703 comprises a high-k material (e.g., K greater than or equal to 9) such as $Ta_2O_5$, $Al_2O_3$, Hf oxides, Ta oxides, Ti oxides, Zr oxides, Al oxides, La oxides (e.g., $HfO_2$, HfSiO, HfSiON, HfTaO, HfTIO, HfZrO, LaO, ZrO, TiO), combinations of these, or the like, deposited through a process such as atomic layer deposition, chemical vapor deposition, or the like. In some embodiments, the gate dielectric 703 comprises a nitrogen doped oxide dielectric that is initially formed prior to forming a metal content high-K (e.g., K value>13) dielectric material. The gate dielectric 703 may be deposited to a thickness of from about 1 nm to about 3 nm, although any suitable material and thickness may be utilized.

Further, the method 10 forms a metal layer 70 over the gate dielectric 703. In some embodiments, the metal layer 70 is formed using multiple layers, each layer deposited sequentially adjacent to each other using a highly conformal deposition process such as atomic layer deposition, although any suitable deposition process may be utilized. According to some embodiments, a capping layer, a barrier layer, an n-metal work function layer, a p-metal work function layer, and a fill material may be provided.

The capping layer may be formed adjacent to the gate dielectric 703 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as atomic layer deposition, chemical vapor deposition, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt. TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-metal work function layer may be formed adjacent to the barrier layer. In an embodiment the n-metal work function layer is a material such as W, Cu, AlCu, TiAlC, TiAlN, TiAl, Pt, Ti, TiN, Ta, TaN, Co, Ni, Ag, Al, TaAl, TaAlC, TaC. TaCN, TaSiN, Mn, Zr, other suitable n-type work function materials, or combinations thereof. For example, the first n-metal work function layer may be deposited utilizing an atomic layer deposition (ALD) process, CVD process, or the like. However, any suitable materials and processes may be utilized to form the n-metal work function layer.

The p-metal work function layer may be formed adjacent to the n-metal work function layer. In an embodiment, the first p-metal work function layer may be formed from a metallic material such as W. Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-metal work function layer may be deposited using a deposition process such as atomic layer deposition, chemical vapor deposition, or the like, although any suitable deposition process may be used.

After the p-metal work function layer has been formed, the fill material is deposited to fill a remainder of the opening. In an embodiment the fill material may be a material such as tungsten, Al, Cu, AlCu, W, Ti, TiAlN, TiAl, Pt, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. However, any suitable material may be utilized.

After the openings left behind by the removal of the dummy gate electrode 303 have been filled, the materials of the metal layer 70 and the gate dielectric 703 may be planarized in order to remove any material that is outside of the openings left behind by the removal of the dummy gate electrode 303. In a particular embodiment the removal may be performed using a planarization process such as chemical mechanical polishing, although any suitable planarization and removal process may be utilized. According to some embodiments, the metal layer, i.e., gate electrodes, may be formed to a vertical height, in the Z-direction, of from 70 nm to 85 nm. However, any suitable height may be used.

Cross-referencing FIGS. 1 and 4, method 10 may continue, at S15, with patterning a hard mask 400 over the metal layer 70. In some embodiments, the hard mask 400 may include multiple layers, such as a bottom layer 401, a middle layer 402, and a top layer 403. In some embodiments, the bottom layer 401 is silicon nitride, the middle layer 402 is silicon, and the top layer 403 is silicon nitride. However, other suitable materials and arrangements may be used.

As further shown, a patterning mask 500 is formed over the hard mask 400. The patterning mask 500 may include multiple layers, such as a bottom layer 501, a middle layer 502, and a top layer 503. In some embodiments, the bottom layer 501 is a bottom anti-reflective coating (BARC). The BARC may provide for absorption of radiation incident to the substrate during photolithography processes, including exposure of an overlying photoresist layer. In some embodiments, the middle layer 502 includes a reflective multilayer structure. In some embodiments, the top layer 503 is a photosensitive mask (e.g., photoresist).

As shown, the photoresist 503 is patterned to include a gap 505 aligned with a region 506 of the metal layer 70 selected for removal.

Figure 5:
Figure 5:
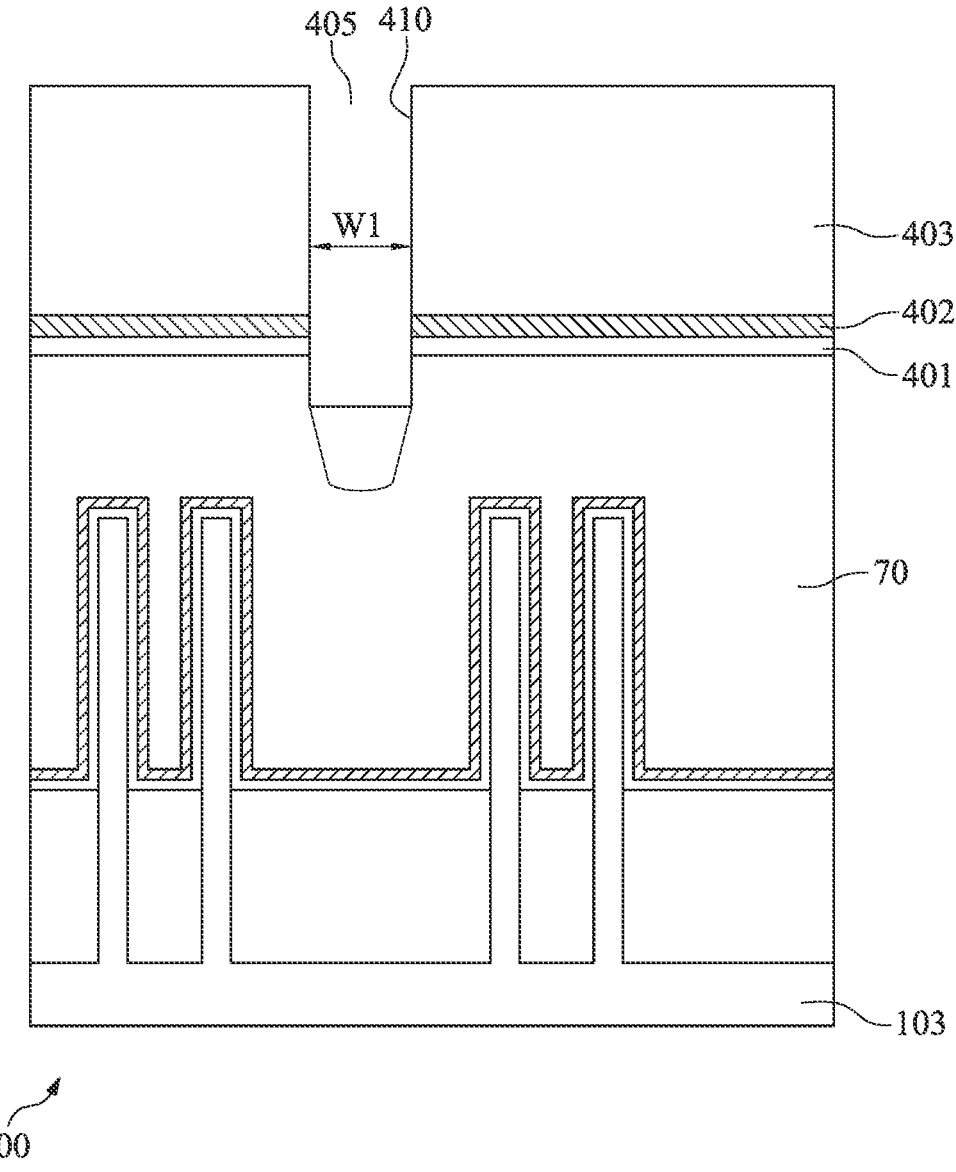

As shown in FIG. 5, patterning the hard mask 400 includes etching the hard mask 400 through the gap 505. Thereafter, the patterning mask 500 may be removed.

As shown, etching the hard mask 400 through gap 505 results in formation of an opening 405 through the hard mask 400. Thus, the hard mask 400 is formed with a sidewall 410 that bounds and defines the opening 405. The opening 405 may have a lateral width W1, from sidewall to sidewall, of from 10 to 30 nm, such as from 12 to 20 nm, for example from 14 to 18 nm, such as 16 nm. The opening 405 may extend a shallow depth into the metal layer 70.

With the structure of the device 100 in FIG. 5, method 10 is prepared to form a high aspect ratio trench through the metal layer 70, such as in a cut-metal process to define separate gates and devices.

Cross-referencing FIGS. 1 and 6, method 10 includes, at S16, etching a trench 600 through the metal layer 70 and into the shallow trench isolation regions 209.

In some embodiments, the etching process is a plasma etching process. In some embodiments, the etching process includes cycles of deposition and cycles of etching. For example, in order to prevent etching of the sidewalls 410 and top surface 409 of the hard mask 400, a deposition process may be performed to form a film 700 on the sidewalls 410 and top surface 409 of the hard mask 400. In some embodiments, the film 700 is uniform. In some embodiments, a non-conformal process is used to form the film 700.

After formation of the film 700, etching processes may be performed to etch the metal layer 70. During such etching processes, the film 700 may be slowly etched. Therefore, after etching the metal layer 70 to a first depth 601, the etching process may be stopped and the deposition process may be repeated to re-form the film 700 on the sidewalls 410 and top surface 409 of the hard mask 400 again.

After re-forming the film 700, etching processes may again be performed to etch the metal layer 70. Again, during such etching processes, the re-formed film 700 may be slowly etched. Therefore, after etching the metal layer 70 to a second depth 602, the etching process may be stopped and the deposition process may be repeated to again re-form the film 700 on the sidewalls 410 and top surface 409 of the hard mask 400.

While the method 10 has been described as forming the uniform layer 700 on three separate occasions, the uniform layer 700 may be formed as many times as is suitable. Generally, the uniform layer 700 may be formed before or when the previously-formed uniform layer 700 is completely removed in order to minimize or control etching of the hard mask 400.

As a result of keeping a protective film 700 on the sidewalls 410 and the top surface 409 of the hard mask, the flow of plasma etchant may be controlled such that byproduct accumulation does not occur along the sidewalls of the trench 600. As a result, the trench 600 is formed in a vertical direction, with reduced tilt angle.

As described herein, the plasma etching process can be used for any metal etching processes. Further, the plasma etching process includes cycles of deposition and etching steps.

As provided, a multiple step etching process may be used to tune the desired trim shape.

In some embodiments, the film 700 is formed a carbon nitride material. For example, the film 700 may be formed by performing a CH4/N2 deposition step for depositing a carbon nitride material on the sidewalls 410 of the hard mask 400.

In some embodiments, the CH4/N2 deposition step is performed with a CH4 flow rate of from 10 to 200 sccm. In some embodiments, the CH4/N2 deposition step is performed with a N2 flow rate of from 50 to 300 sccm. In some embodiments, the CH4/N2 deposition step is performed with a He flow rate of from 10 to 200 sccm. In some embodiments, the CH4/N2 deposition step is performed with a pressure range of from 2 to 50 mT. In some embodiments, the CH4/N2 deposition step is performed with a plasma power range of from 0 to 600 W.

In some embodiments, the CH4/N2 deposition step is performed with a source power three state pulsing duty ratio % of 20/60/20 and a power of 1948W/1948W/0W.

In some embodiments, the CH4/N2 deposition step is performed with bias pulsing, including three state pulsing duty ratio % of 20/60/20 and a power of 220W/45W/0W.

In some embodiments, the plasma etching process includes etching steps performed with a metal etching gas selected from bromide (Br), hydrogen bromide (HBr), nitrogen (N2), fluorocarbon (CxFy) (where x+y=1), and hydrofluorocarbon (CxFyHz) (where x+y+2=1).

Figure 7:
Figure 7:
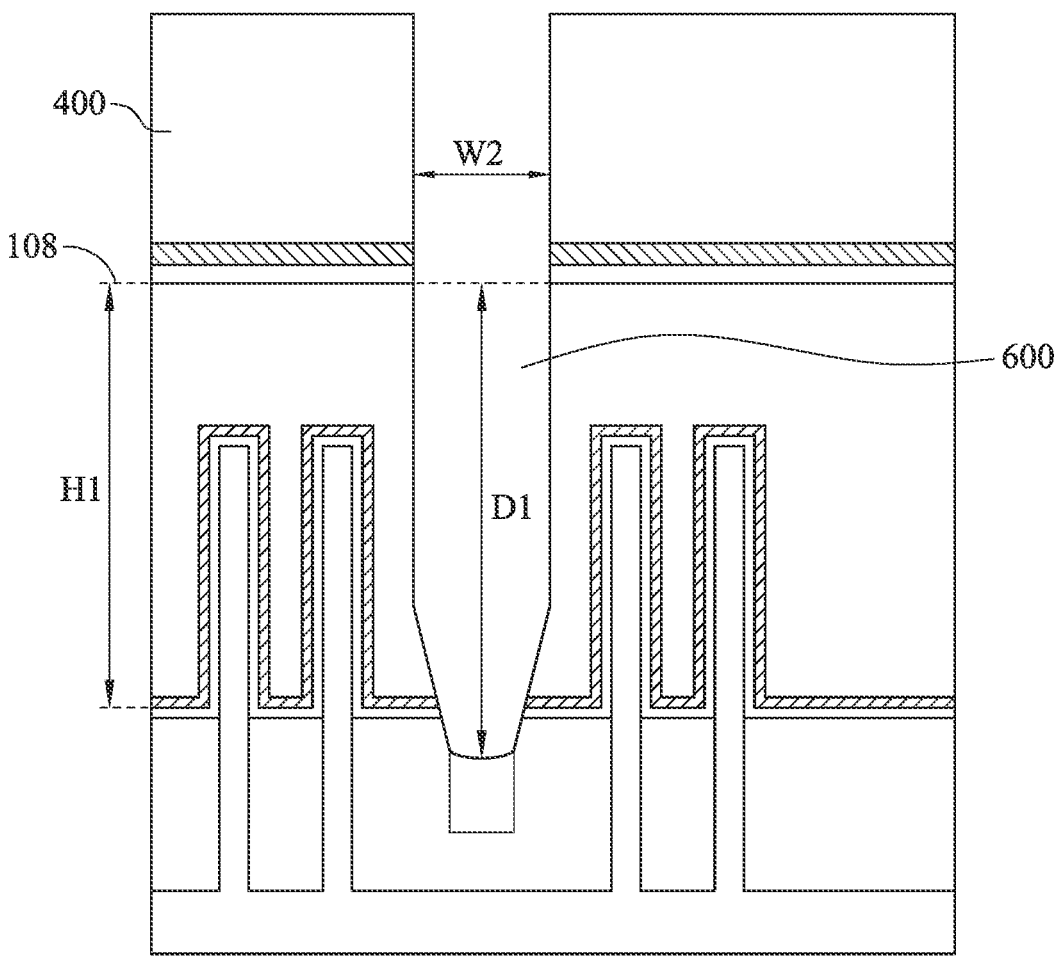

Referring to FIG. 7, as a result of the plasma etching process, the trench 600 is formed with a vertical depth D1, measured from a plane 108 defined by the top surface of the metal layer 70. In some embodiments, vertical depth D1 is from 100 to 150 nm. Further, the metal layer 70 has a vertical height H1 of from 70 to 85 nm. Thus, the trench 600 may extend into the isolation region 209 for a vertical depth of 15 to 80 nm. As further shown, the trench 600 has a lateral width W2 at the plane 108 of from 15 to 20 nm.

Figure 8:

Cross-referencing FIGS. 1 and 8, method 10 may continue at S17 with forming a cut-metal dielectric structure 109 in trench 600 to isolation the adjacent metal layers 70 from one another. The cut-metal dielectric structure 109 may be formed by initially depositing a dielectric material to fill and overfill the trench 600. In accordance with some embodiments, the cut-metal dielectric structure 109 are formed using any suitable dielectric material and deposition process. For example, the cut-metal dielectric structure 109 may be formed from silicon nitride (SiN) in a deposition process such as Atomic Layer Deposition (ALD). However, any suitable dielectric materials and deposition processes may be used. After depositing the dielectric material, excess dielectric material and the hard mask 400 may be removed, such as by chemical mechanical planarization (CMP).

As shown, the cut-metal dielectric structure 109 divides the metal layer 70 into two gate electrodes 107 and isolates the segmented gate electrodes 107 from one another.

As shown in FIG. 1, method 10 may continue, at S18, with further processing for completing the device 100. For example, the further processing may include forming a Continuous Poly On Diffusion Edge (CPODE), interlayer dielectric and metallization layers, forming source/drain contacts to the source/drain regions, and forming source/drain vias and gate vias, in accordance with some embodiments.

Figure 9:
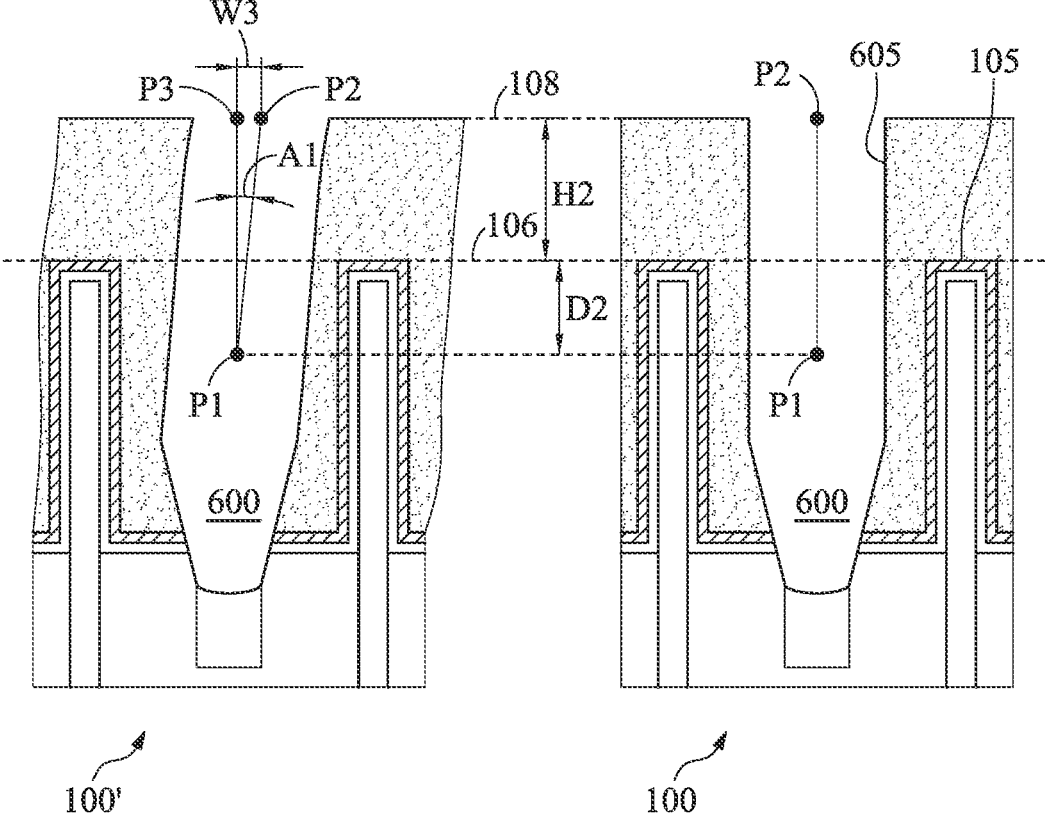
FIG. 9 is a cross-sectional view of a tilted trench and a vertical trench as formed in FIG. 7, in accordance with some embodiments.

Referring now to FIG. 9, the tilt angle of the trench 600 is described. FIG. 9 illustrates a device 100' formed with a tilted trench and a device 100 formed with a vertical trench at the stage of fabrication after formation of trench 600. In each device, a midpoint P1, equally distanced from opposite sidewalls of the trench, is located at a depth D2 below a plane 106 defined by the top of the fins 105. For purposes of calculation, depth D2 is 25 nm, though any suitable depth may be used. In each device, a midpoint P2, equally distanced from opposite sidewalls of the trench, is located at plane 108 at a height H2 above plane 106 defined by the top of the fins 105. In FIG. 9, height H2 is 13.5 nm.

In the tilted trench 600 of device 100' in FIG. 9, a vertical line from point P1 intersects plane 108 at point P3. Further, point P2 is distanced from point P3 by a lateral tilt margin W3. In a non-tilted trench 600, such as in device 100 in FIG. 9, point P2 is vertically aligned with point P1, and the tilt margin is zero.

Thus, the tilt angle in device 100 is zero. The tilt angle A1 in device 100' is equal to the arctangent of W3/H2.

In exemplary embodiments, the tilt margin W3 of a device 100 formed by method 10 is less than 3 nm, such as less than 2.5 nm, less than 2.0 nm, less than 1.8 nm, less than 1.6 nm, less than 1.4 nm, less than 1.2 nm, or less than 1 nm. In exemplary embodiments, the tilt angle A1 of a device 100 formed by method 10 is less than 3°, such as less than 2.5°, less than 2°, less than 1.9°, less than 1.8°, less than 1.7°, less than 1.6°, less than 1.5°, less than 1.4°, less than 1.3°, less than 1.2°, less than 1.1°, less than 1.0°, less than 0.9°, less than 0.8°, less than 0.7°, less than 0.6°, less than 0.5°, less than 0.4°, less than 0.3°, less than 0.2°, or less than 0.1°.

The vertical trench 600 of device 100 in FIG. 9 has a sidewall 605. In certain embodiments, the profile of the sidewall 605 is vertical, i.e., the sidewall 605 is perpendicular to the substrate 103. In some embodiments, the sidewall 605 is within 3° of perpendicular to the semiconductor substrate 103, i.e., is from 87 to 93°, or is within 2.5°, within 2°, within 1.9°, within 1.8°, within 1.7°, within 1.6°, within 1.5°, within 1.4°, within 1.3°, within 1.2°, within 1.1°, within 1.0°, within 0.9°, within 0.8°, within 0.7°, within 0.6°, within 0.5°, within 0.4°, within 0.3°, within 0.2°, or within 0.1° of perpendicular to the semiconductor substrate 103.

In an embodiment, a method for processing a metal gate includes forming a metal gate line over a semiconductor substrate; patterning a hard mask over the metal gate line, an opening in the hard mask is located over a region of the metal gate line to be removed, and the hard mask includes sidewalls defining the opening; and performing a plasma etching process through the opening, the plasma etching process includes a CH4/N2 deposition step for depositing a carbon nitride material on the sidewalls of the hard mask.

In some embodiments of the method, the plasma etching process includes a first deposition step for depositing the carbon nitride material as a first carbon nitride material layer on the sidewalls of the hard mask; a first etching step to etch the metal gate line to a first depth; a second deposition step for re-forming carbon nitride material on the sidewalls of the hard mask as a second carbon nitride material layer; and a second etching step to etch the metal gate line to a second depth.

In some embodiments, the plasma etching process further includes a third deposition step for depositing the carbon nitride material as a third carbon nitride material layer on the sidewalls of the hard mask; and a third etching step to etch the metal gate line to a third depth.

In some embodiments of the method, the plasma etching process forms a trench through the metal gate line and into an isolation region lying below the metal gate line.

In some embodiments of the method, the plasma etching process forms a trench extending through the metal gate line, and wherein the trench has a tilt angle of less than 1.5°.

In some embodiments of the method, the plasma etching process forms a trench extending through the metal gate line, the trench has a sidewall, and the sidewall of the trench is perpendicular to the semiconductor substrate or within 1.5° of perpendicular to the semiconductor substrate.

In some embodiments of the method, the CH4/N2 deposition step is performed with a CH4 flow rate of from 10 to 200 sccm; with a N2 flow rate of from 50 to 300 sccm; with a He flow rate of from 10 to 200 sccm; with a pressure range of from 2 to 50 mT; and with a plasma power range of from 0 to 600 W.

In some embodiments of the method, the plasma etching process includes cycled deposition and etching steps.

In some embodiments of the method, the plasma etching process includes etching steps performed with a metal etching gas selected from bromide (Br), hydrogen bromide (HBr), nitrogen (N2), fluorocarbon (CxFy), and hydrofluorocarbon (CxFyHz).

In another embodiment, a method for fabricating a semiconductor device includes forming fin structures over a semiconductor substrate; forming a metal layer over a fin structures; forming a mask with an opening over the metal layer, the opening is defined by a sidewall; depositing a carbon nitride film on the sidewall; and etching the metal layer through the opening while protecting the mask with the carbon nitride film.

In some embodiments of the method, etching the metal layer through the opening while protecting the mask with the carbon nitride film includes forming a trench extending through the metal layer, wherein the trench has a sidewall, and wherein the sidewall of the trench is perpendicular to the semiconductor substrate or within 1.5° of perpendicular to the semiconductor substrate.

In some embodiments, the method further includes repeating depositing the carbon nitride film on the sidewall and etching the metal layer through the opening while protecting the mask with the carbon nitride film.

In some embodiments of the method, depositing the carbon nitride film on the sidewall includes performing a plasma deposition process with CH4/N2.

In some embodiments of the method, the plasma deposition process is performed with a CH4 flow rate of from 10 to 200 sccm and a N2 flow rate of from 50 to 300 sccm.

In some embodiments of the method, etching the metal layer through the opening while protecting the mask with the carbon nitride film includes forming a trench through the metal layer, and the trench has a tilt angle of less than 1.5°.

In some embodiments of the method, etching the metal layer through the opening while protecting the mask with the carbon nitride film includes forming a trench through the metal layer, and the trench has a vertical depth from a top surface of the metal layer of from 100 to 150 nm.

In some embodiments of the method, the trench has a lateral width at a top surface of the metal layer of from 15 to 20 nm.

In another embodiment, a method for etching metal includes forming a hard mask over the metal, the hard mask includes a sidewall defining an opening; and performing a plasma etching process including cycles of depositing a carbon nitride film on the sidewall and etching the metal.

In some embodiments of the method, the metal lies over a semiconductor substrate; performing the plasma etching process including cycles of depositing a carbon nitride film on the sidewall and etching the metal includes forming a trench extending through the metal; the trench has a sidewall; and the sidewall of the trench is perpendicular to the semiconductor substrate or within 1.5° of perpendicular to the semiconductor substrate.

In some embodiments of the method, each cycle of depositing a carbon nitride film on the sidewall includes performing a plasma deposition process with CH4/N2; with a CH4 flow rate of from 10 to 200 sccm and a N2 flow rate of from 50 to 300 sccm.

In some embodiments of the method, performing the plasma etching process includes etching the metal to form a trench, the trench has a tilt angle of less than 1.5°, the trench has a vertical depth from a top surface of the metal of from 100 to 150 nm, and the trench has a lateral width at a top surface of the metal of from 15 to 20 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A method comprising:
patterning a hard mask over a metal structure, wherein an opening in the hard mask is located over a region of the metal structure to be removed, and wherein the hard mask includes sidewalls defining the opening; and
performing a plasma etching process through the opening, wherein the plasma etching process includes a CH4/N2 deposition step for depositing a carbon nitride material on the sidewalls of the hard mask, and wherein the CH4/N2 deposition step is performed with a CH4 flow rate of from 10 to 200 sccm and a N2 flow rate of from 50 to 300 sccm.

2. The method of claim 1, wherein the plasma etching process comprises:
a first deposition step for depositing the carbon nitride material as a first carbon nitride material layer on the sidewalls of the hard mask;
a first etching step to etch the metal structure to a first depth;
a second deposition step for re-forming carbon nitride material on the sidewalls of the hard mask as a second carbon nitride material layer; and
a second etching step to etch the metal structure to a second depth.

3. The method of claim 2, wherein the plasma etching process comprises:
a third deposition step for depositing the carbon nitride material as a third carbon nitride material layer on the sidewalls of the hard mask; and
a third etching step to etch the metal structure to a third depth.

4. The method of claim 1, wherein the plasma etching process forms a trench through the metal structure and into an isolation region lying below the metal structure.

5. The method of claim 1, wherein the plasma etching process forms a trench extending through the metal structure, and wherein the trench has a tilt angle of less than 1.5°.

6. The method of claim 1, wherein the plasma etching process forms a trench extending through the metal structure, wherein the trench has a sidewall, and wherein the sidewall of the trench is perpendicular to the semiconductor substrate or within 1.5° of perpendicular to the semiconductor substrate.

7. The method of claim 1, wherein the CH4/N2 deposition step is performed with:
a He flow rate of from 10 to 200 sccm;
a pressure range of from 2 to 50 mT; and
a plasma power range of from 0 to 600 W.

8. The method of claim 1, wherein the plasma etching process includes cycled deposition and etching steps.

9. The method of claim 1, wherein the plasma etching process includes etching steps performed with a metal etching gas selected from hydrogen bromide (HBr), nitrogen (N2), fluorocarbon (CxFy), and hydrofluorocarbon (CxFyHz).

10. A method for fabricating a semiconductor device, the method comprising:
forming fin structures over a semiconductor substrate;
forming a metal layer over the fin structures;
forming a mask with an opening over the metal layer, wherein the opening is defined by a sidewall;
depositing a carbon nitride film on the sidewall;
etching the metal layer through the opening with a metal etch process while protecting the mask with the carbon nitride film; and
when the metal etch process removes the carbon nitride film from the sidewall, re-forming the carbon nitride film on the sidewall, wherein the carbon nitride film prevents accumulation of a byproduct from the metal etch process on the sidewalls of the hard mask.

11. The method of claim 10, wherein etching the metal layer through the opening while protecting the mask with the carbon nitride film comprises forming a trench extending through the metal layer, wherein the trench has a sidewall, and wherein the sidewall of the trench is perpendicular to the semiconductor substrate or within 1.5° of perpendicular to the semiconductor substrate.

12. The method of claim 10, wherein the metal etch process separates the metal layer into two distinct metal structures, and wherein the method further comprises forming a dielectric structure between the two distinct metal structures.

13. The method of claim 10, wherein depositing the carbon nitride film on the sidewall comprises performing a plasma deposition process with CH4/N2, and wherein the plasma deposition process is performed with a CH4 flow rate of from 10 to 200 sccm and a N2 flow rate of from 50 to 300 sccm.

14. The method of claim 10, wherein etching the metal layer through the opening while protecting the mask with the carbon nitride film comprises forming a trench through the metal layer, and wherein the trench has a tilt angle of less than 1.5°.

15. The method of claim 10, wherein etching the metal layer through the opening while protecting the mask with the carbon nitride film comprises forming a trench through the metal layer, and wherein the trench has a vertical depth from a top surface of the metal layer of from 100 to 150 nm.

16. The method of claim 15, wherein the trench has a lateral width at a top surface of the metal layer of from 15 to 20 nm.

17. A method for etching metal, the method comprising:
forming a hard mask over the metal, wherein the hard mask includes a sidewall defining an opening; and
performing a plasma etching process including cycles of depositing a carbon nitride film on the sidewall and etching the metal, wherein the carbon nitride film is not formed on the metal.

18. The method of claim 17, wherein:
the metal lies over a semiconductor substrate;
performing the plasma etching process including cycles of depositing a carbon nitride film on the sidewall and etching the metal comprises forming a trench extending through the metal;
the trench has a trench sidewall; and
the trench sidewall is perpendicular to the semiconductor substrate or within 1.5° of perpendicular to the semiconductor substrate.

19. The method of claim 17, wherein each cycle of depositing a carbon nitride film on the sidewall comprises performing a plasma deposition process with CH4/N2, and wherein the plasma deposition process is performed with a CH4 flow rate of from 10 to 200 sccm and a N2 flow rate of from 50 to 300 sccm.

20. The method of claim 17, wherein performing the plasma etching process comprises etching the metal to form a trench, wherein the trench has a tilt angle of less than 1.5°, wherein the trench has a vertical depth from a top surface of the metal of from 100 to 150 nm, and wherein the trench has a lateral width at a top surface of the metal of from 15 to 20 nm.

* * * * *